(12) United States Patent
Lee et al.

(10) Patent No.: US 11,527,710 B2
(45) Date of Patent: Dec. 13, 2022

(54) SEMICONDUCTOR DEVICE AND METHOD FOR FABRICATING THE SAME

(71) Applicant: UNITED MICROELECTRONICS CORP., Hsin-Chu (TW)

(72) Inventors: Pei-Jou Lee, Tainan (TW); Kun-Chen Ho, Tainan (TW); Hsuan-Hsu Chen, Tainan (TW); Chun-Lung Chen, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 35 days.

(21) Appl. No.: 16/529,779

(22) Filed: Aug. 1, 2019

(65) Prior Publication Data
US 2021/0013401 A1    Jan. 14, 2021

(30) Foreign Application Priority Data
Jul. 8, 2019    (CN) .......................... 201910609150.9

(51) Int. Cl.
*H01L 43/12* (2006.01)
*H01L 27/22* (2006.01)
*H01L 43/02* (2006.01)
*H01L 43/08* (2006.01)

(52) U.S. Cl.
CPC ............ *H01L 43/12* (2013.01); *H01L 27/228* (2013.01); *H01L 43/02* (2013.01); *H01L 43/08* (2013.01)

(58) Field of Classification Search
CPC .................................................. H01L 21/76805
See application file for complete search history.

(56) References Cited

U.S. PATENT DOCUMENTS

| | | | | |
|---|---|---|---|---|
| 2011/0089511 A1* | 4/2011 | Keshtbod | ............... | B82Y 10/00 257/422 |
| 2013/0015541 A1* | 1/2013 | Kanaya | .................... | H01L 43/12 257/421 |
| 2014/0061917 A1* | 3/2014 | Kim | .................. | H01L 21/76816 257/751 |
| 2015/0069547 A1* | 3/2015 | Iwayama | ................ | H01L 43/12 257/421 |
| 2015/0311253 A1* | 10/2015 | Choi | ........................ | H01L 43/08 257/252 |
| 2016/0365513 A1* | 12/2016 | Sung | ........................ | H01L 43/12 |
| 2018/0211995 A1* | 7/2018 | Bak | ........................ | H01L 43/12 |
| 2019/0074440 A1* | 3/2019 | Yang | ...................... | H01L 45/085 |
| 2020/0098982 A1* | 3/2020 | Chuang | ................... | H01L 43/12 |

* cited by examiner

*Primary Examiner* — Bryan R Junge
(74) *Attorney, Agent, or Firm* — Winston Hsu

(57) ABSTRACT

A method for fabricating semiconductor device includes the steps of: forming a magnetic tunneling junction (MTJ) on a substrate and a top electrode on the MTJ; forming a first inter-metal dielectric (IMD) layer around the MTJ and the top electrode; forming a stop layer on the first IMD layer; forming a second IMD layer on the stop layer; performing a first etching process to remove the second IMD layer and the stop layer; performing a second etching process to remove part of the top electrode; and forming a metal interconnection to connect to the top electrode.

1 Claim, 4 Drawing Sheets

SEMICONDUCTOR DEVICE AND METHOD FOR FABRICATING THE SAME

BACKGROUND OF THE INVENTION

1. Field of the Invention

The invention relates to a semiconductor device and method for fabricating the same, and more particularly to a magnetoresistive random access memory (MRAM) and method for fabricating the same.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating semiconductor device includes the steps of: forming a magnetic tunneling junction (MTJ) on a substrate and a top electrode on the MTJ; forming a first inter-metal dielectric (IMD) layer around the MTJ and the top electrode; forming a stop layer on the first IMD layer; forming a second IMD layer on the stop layer; performing a first etching process to remove the second IMD layer and the stop layer; performing a second etching process to remove part of the top electrode; and forming a metal interconnection to connect to the top electrode.

According to another aspect of the present invention, a semiconductor device includes: a magnetic tunneling junction (MTJ) on a substrate, a top electrode on the MTJ, and a first inter-metal dielectric (IMD) layer around the MTJ and the top electrode. Preferably, a top surface of the top electrode adjacent to a first sidewall of the top electrode is different from the top surface of the top electrode adjacent to a second sidewall of the top electrode.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
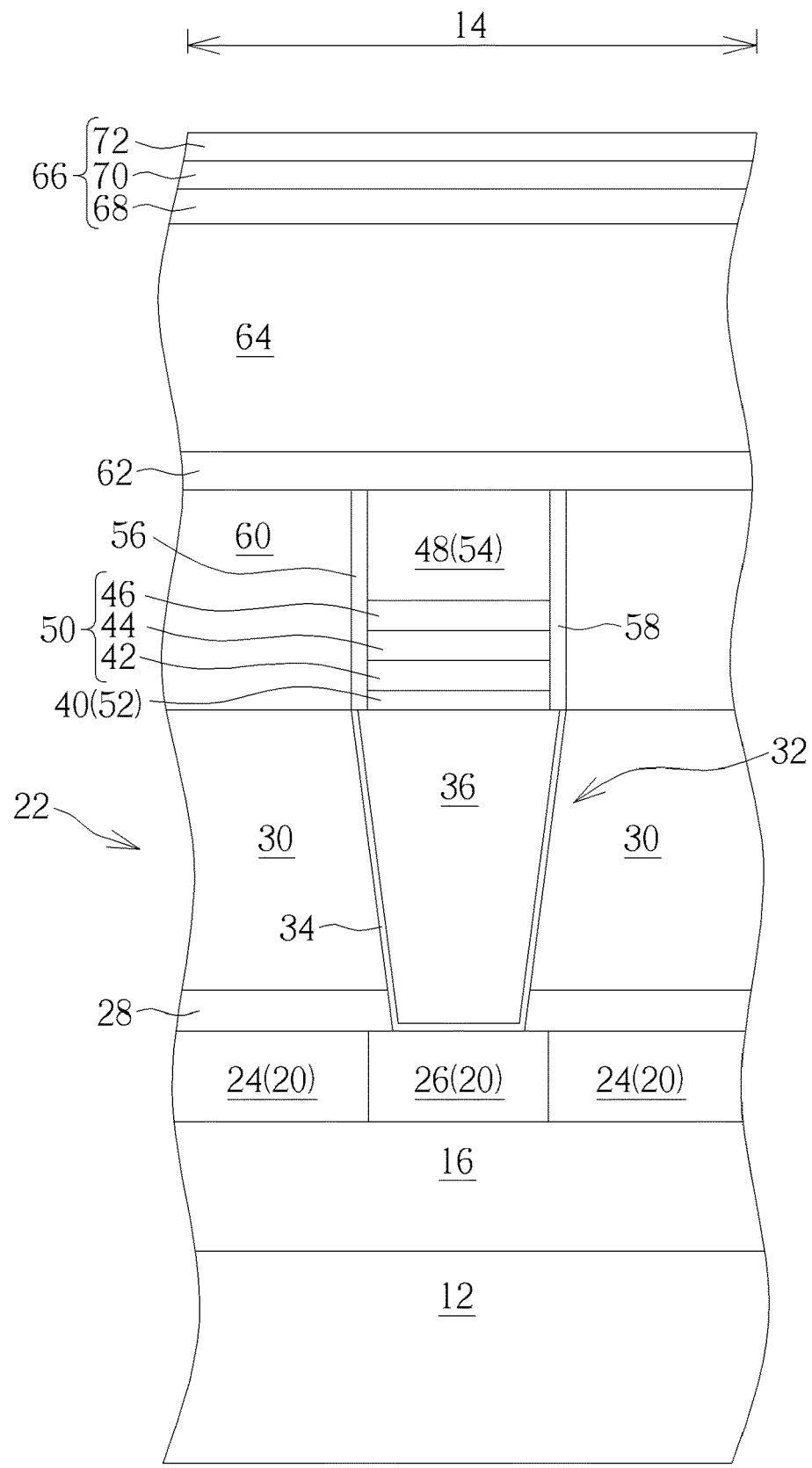
FIGS. 1-4 illustrate a method for fabricating a MRAM device according to an embodiment of the present invention.

Referring to FIGS. 1-4, FIGS. 1-4 illustrate a method for fabricating a semiconductor device, or more specifically a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MTJ region 14 and a logic region (not shown) are defined on the substrate 12.

Active devices such as metal-oxide semiconductor (MOS) transistors, passive devices, conductive layers, and interlayer dielectric (ILD) layer 16 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 16 could be formed on the substrate 12 to cover the MOS transistors, and a plurality of contact plugs could be formed in the ILD layer 16 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 16 to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and metal interconnections 32 embedded in the stop layer 28 and the IMD layer 30.

In this embodiment, each of the metal interconnections 26 from the metal interconnect structure 20 preferably includes a trench conductor and each of the metal interconnections 32 from the metal interconnect structure 22 on the MTJ region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further includes a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal interconnections 26 are preferably made of copper, the metal layers 36 are preferably made of tungsten, the IMD layers 24, 30 are preferably made of silicon oxide, and the stop layers 28 is preferably made of nitrogen doped carbide (NDC), silicon nitride, silicon carbon nitride (SiCN), or combination thereof.

Next, a MTJ stack or stack structure is formed on the metal interconnect structure 22. In this embodiment, the formation of the MTJ stack could be accomplished by sequentially depositing a first electrode layer 40, a fixed layer 42, a barrier layer 44, a free layer 46, and a second electrode layer 48 on the IMD layer 30. In this embodiment, the first electrode layer 40 and the second electrode layer 48 are preferably made of conductive material including but not limited to for example Ta, Pt, Cu, Au, Al, or combination thereof. The fixed layer 42 could be made of antiferromagnetic (AFM) material including but not limited to for example ferromanganese (FeMn), platinum manganese (PtMn), iridium manganese (IrMn), nickel oxide (NiO), or combination thereof, in which the fixed layer 42 is formed to fix or limit the direction of magnetic moment of adjacent layers. The barrier layer 44 could be made of insulating material including but not limited to for example oxides such as aluminum oxide ($AlO_x$) or magnesium oxide (MgO). The free layer 46 could be made of ferromagnetic material including but not limited to for example iron, cobalt, nickel, or alloys thereof such as cobalt-iron-boron (CoFeB), in which the magnetized direction of the free layer 46 could be altered freely depending on the influence of outside magnetic field.

Next, one or more etching process is conducted by using a patterned mask (not shown) as mask to remove a part of the MTJ stack to form top and bottom electrodes and MTJ 50 on the metal interconnection 32, in which the first electrode layer 40 preferably becomes a bottom electrode 52 of the MTJ 50 and the second electrode layer 48 becomes the top electrode 54 of the MTJ 50 at this stage. Next, a liner or cap layer (not shown) is formed on the surface of the MTJ 50 and the IMD layer 30, and an etching process is conducted to remove part of the liner to form a spacer surrounding the MTJ 50, including a spacer 56 on left side of the MTJ 50 and a spacer 58 on right side of the MTJ 50. In this embodiment, spacers 56, 58 are preferably made of silicon nitride, but could also include other dielectric material including but not limited to for example silicon oxide, silicon oxynitride (SiON), or silicon carbon nitride (SiCN).

Next, another IMD layer 60 is formed to cover the MTJ 50, and a planarizing process such as chemical mechanical polishing (CMP) process is conducted to remove part of the IMD layer 60 so that the top surfaces of the IMD layer 60, spacers 56, 58, and top electrode 54 are coplanar. Next, a stop layer 62 is formed on the surface of the IMD layer 60, an IMD layer 64 is formed on the stop layer 62, and a patterned mask 66 is formed on the IMD layer 64 thereafter. In this embodiment, the stop layer 52 preferably includes nitrogen doped carbide (NDC), the IMD layer 64 preferably includes an ultra low-k (ULK) dielectric layer including but not limited to for example porous material or silicon oxycarbide (SiOC), and the patterned hard mask 66 preferably includes a mask layer 58, a mask layer 70, and a mask layer 72, in which the mask layer 68 preferably includes SiON, the mask layer 70 includes titanium nitride (TiN), and the mask layer 72 includes silicon oxide.

Figure 2:
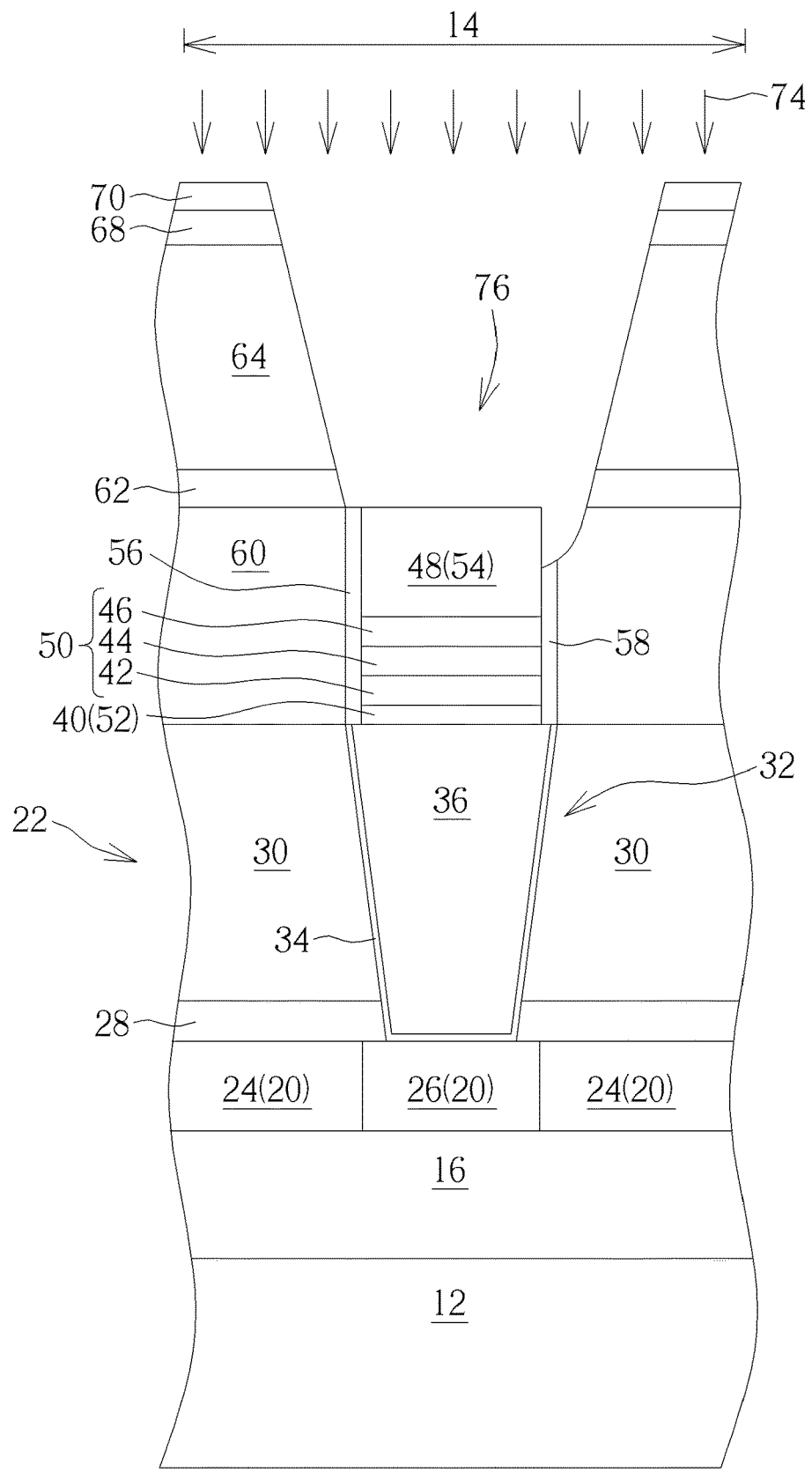

Next, as shown in FIG. 2, a first etching process 74 is conducted to remove part of the mask layer 72, part of the mask layer 70, part of the mask layer 68, part of the IMD layer 64, part of the stop layer 62, part of the spacer 58, and part of the IMD layer 60 to form a contact hole 76, in which the mask layer 72 could be consumed completely during the first etching process 74. In this embodiment, the first etching process 74 preferably includes a dry etching process, which could be accomplished by using octafluorocyclobutane ($C_4F_8$) and/or carbon tetrafluoride ($CF_4$) as main etching gas to remove the above material layers without removing any of the top electrode 54 for forming the contact hole 76. It should be noted that the first etching process 74 conducted at this stage not only removes the mask layers above the top electrode 54 but also part of the spacer 58 and part of the IMD layer 60 adjacent to one side of the top electrode 54 to form asymmetrical spacers 56, 58 while extending the contact holes 76 into part of the IMD layer 60. Since the top electrode 54 is untouched by the etching gas at this stage, each of the angle included by the top surface and right sidewall of the top electrode 54 and the angle included by the top surface and left sidewall of the top electrode 54 includes a right angle.

Figure 3:
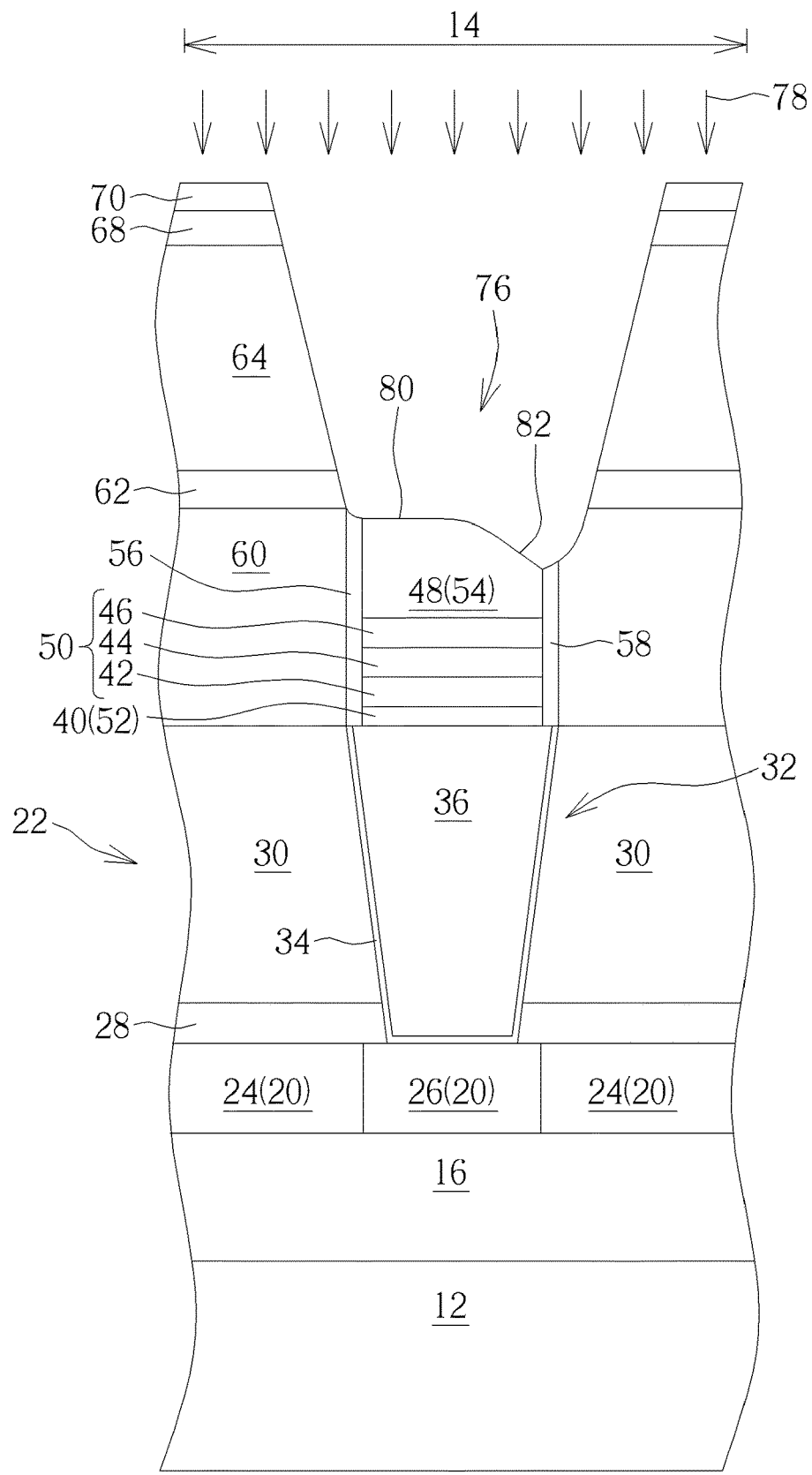

Next, as shown in FIG. 3, a second etching process 78 is conducted to remove part of the top electrode 54 so that a top surface of the top electrode 54 adjacent to a first sidewall of the top electrode 54 is different from the top surface of the top electrode 54 adjacent to a second sidewall of the top electrode 54. Preferably, the second etching process 78 includes a wet etching process, which could be accomplished by using hydrogen peroxide ($H_2O_2$) and fluorine containing agent including but not limited to for example ammonium fluoride ($NH_4F$) to remove part of the top electrode 54. Specifically, the second etching process 78 conducted at this stage preferably uses hydrogen peroxide to oxidize part of the top electrode 54 made of TiN into titanium oxynitride (TiON), and then uses fluorine containing agent such as ammonium fluoride ($NH_4F$) to remove the TiON so that the top surface of the top electrode 54 adjacent to left sidewall of the top electrode 54 different from the top surface of the top electrode 54 adjacent to right sidewall of the top electrode 54. Preferably, the top surface of the top electrode 54 adjacent to left sidewall of the top electrode 54 and untouched by the second etching process 78 reveals a planar surface 80 parallel to the surface of the substrate 12 whereas part of the top surface of the top electrode 54 adjacent to the right sidewall of the top electrode 54 being removed by the second etching process 78 reveals an inclined surface 82 not parallel with the surface of the substrate 12 or even a curved surface. Viewing from another perspective, the angle included by the top surface of the top electrode 54 and the left sidewall still includes a right angle at 90 degrees whereas the angle included by the top surface of the top electrode 54 and the right sidewall is preferably greater than 90 degrees.

Figure 4:
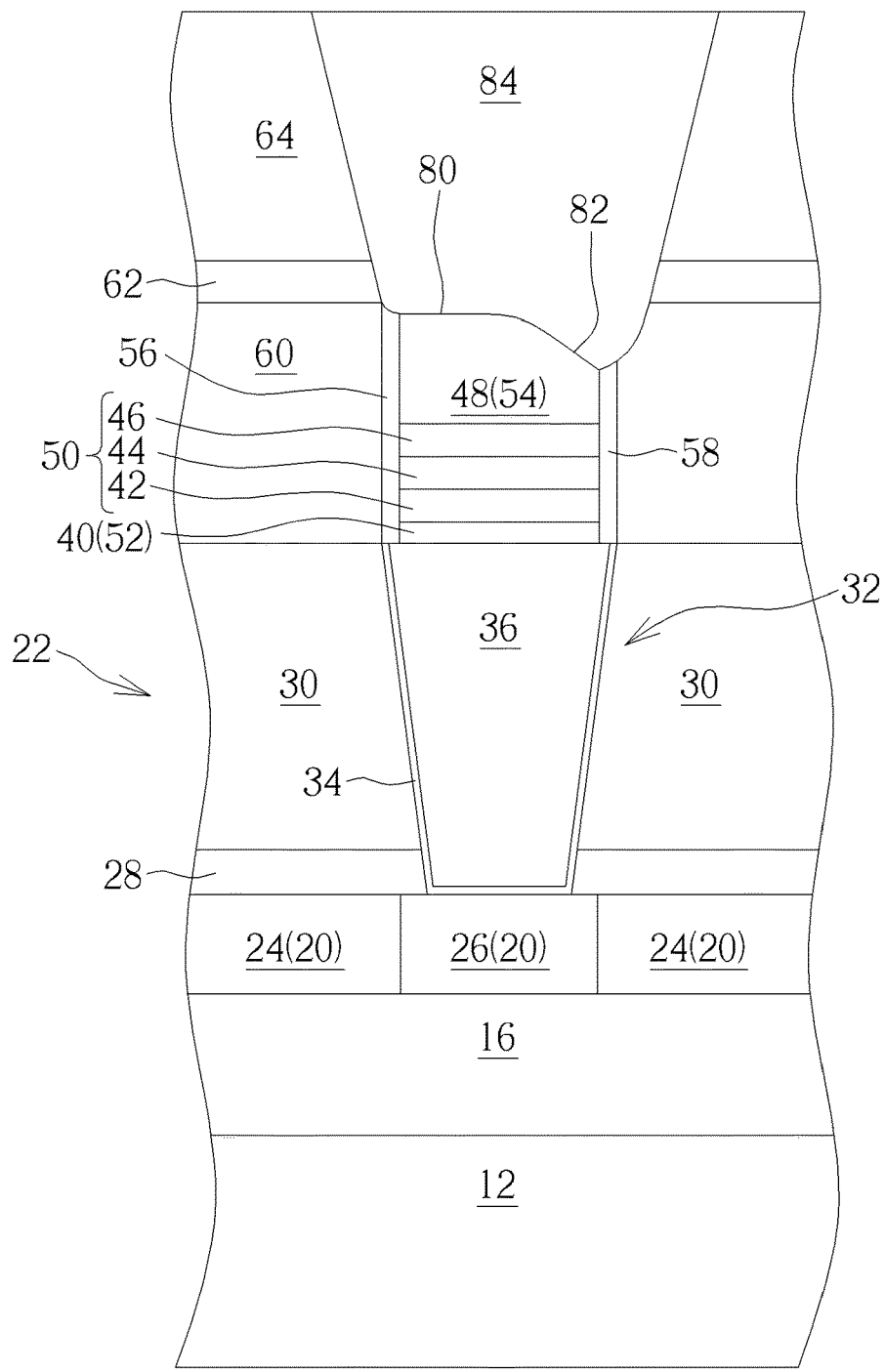

Next, as shown in FIG. 4, metals including a barrier layer selected from the group consisting of titanium (Ti), titanium nitride (TiN), tantalum (Ta), and tantalum nitride (TaN) and a metal layer selected from the group consisting of tungsten (W), copper (Cu), aluminum (Al), titanium aluminide (TiAl), and cobalt tungsten phosphide (CoWP) are deposited into the contact hole 76, and a planarizing process such as chemical mechanical polishing (CMP) process could be conducted to remove part of the metals including the aforementioned barrier layer and metal layer to form a contact plug or metal interconnection 84 in the contact hole 76 electrically connecting the top electrode 54.

Referring again to FIG. 4, FIG. 4 further illustrates a structural view of a semiconductor device according to an embodiment of the present invention. As shown in FIG. 4, the semiconductor device preferably includes a MTJ 50 disposed on the substrate 12, a bottom electrode 52 disposed under the MTJ 50, a top electrode 54 disposed on the MTJ 50, a spacer 56 disposed on left sidewalls of the bottom electrode 52, the MTJ 50, and the top electrode 54, a spacer 58 disposed on right sidewalls of the bottom electrode 52, the MTJ 50, and the top electrode 54, an IMD layer 60 surrounding the spacers 56, 58, a stop layer 62 disposed on the IMD layer 60, an IMD layer 64 disposed on the stop layer 62, and a metal interconnection 84 disposed in the stop layer 62 and IMD layer 64 to directly contact the top electrode 54.

Overall, the top surface of the top electrode 54 adjacent to the left sidewall of the top electrode 54 is different from the top surface of the top electrode 54 adjacent to the right sidewall of the top electrode 54. For instance, the top surface of the top electrode 54 adjacent to its left sidewall preferably includes a planar surface 80 parallel to the surface of the substrate 12 while the top surface of the top electrode 54 adjacent to its right sidewall includes an inclined surface 82 or curved surface nonparallel to the surface of the substrate 12. Preferably, the spacer 56 on left sidewall of the top electrode 54 and the spacer 58 on right sidewall of the top electrode 54 preferably include different heights, in which the height of spacer 58 is preferably less than the height of the spacer 56, or the top surface of the spacer 58 is slightly lower than the top surface of the spacer 56 while the bottom surfaces of the spacers 56, 58 are coplanar. Viewing from a perspective of the metal interconnection 84 connecting the top electrode 54, the bottom surface of the metal interconnection 84 adjacent to left sidewall of the top electrode 54 is different from the bottom surface of the metal interconnection 84 adjacent to right sidewall of the top electrode 54, in which the bottom surface of the metal interconnection 84 adjacent to left sidewall of the top electrode 54 includes a planar surface 80 parallel to the surface of the substrate 12 while the bottom surface of the metal interconnection 84 adjacent to right sidewall of the top electrode 54 includes an inclined surface 82 or a curved surface not parallel to the surface of the substrate 12. Viewing from another perspective, the angle included by the top surface of the top electrode 54 and its left sidewall still includes a right angle at 90 degrees whereas the angle included by the top surface of the top electrode 54 and its right sidewall is greater than 90 degrees.

Overall, the present invention first forms an IMD layer to cover the MTJ, performs a first etching process to remove part of the IMD layer to expose the top electrode above the MTJ, and then performs a second etching process to remove part of the top electrode by transforming a corner of the top electrode having right angle into a round corner. Since one of the top corners of the top electrode is transformed into a round corner through the above two etching processes, it would be desirable to lower the height difference between the top electrode and adjacent IMD layer so that when conductive materials are filled to form metal interconnections, voids or seams could be minimized between metal interconnection and top electrode and performance of the device would be improved substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a magnetic tunneling junction (MTJ) on a substrate;
    a top electrode on the MTJ, wherein a top surface of the top electrode adjacent to a first sidewall of the top electrode comprises a planar surface and the top surface of the top electrode adjacent to a second sidewall of the top electrode comprises an inclined surface;
    a first spacer on the first sidewall of the top electrode, wherein a top surface of the first spacer comprises a first curve directly connected to the planar surface;
    a second spacer on the second sidewall of the top electrode, wherein a top surface of the second spacer comprises a second curve lower than the planar surface of the top electrode and directly connected to the inclined surface; and
    an inter-metal dielectric (IMD) layer around the MTJ and the top electrode, wherein the first curve contacts a top surface of the IMD layer directly.

* * * * *

UNITED STATES PATENT AND TRADEMARK OFFICE
CERTIFICATE OF CORRECTION

PATENT NO. : 11,527,710 B2  
APPLICATION NO. : 16/529779  
DATED : December 13, 2022  
INVENTOR(S) : Pei-Jou Lee et al.

Page 1 of 1

It is certified that error appears in the above-identified patent and that said Letters Patent is hereby corrected as shown below:

On the Title Page

Item (30), correct the application number of the CN Priority application from "201910609150.9" to --201910609150.5--.

Signed and Sealed this  
Seventh Day of February, 2023

Katherine Kelly Vidal  
*Director of the United States Patent and Trademark Office*